United States Patent
Miller et al.

(10) Patent No.: US 8,841,745 B2
(45) Date of Patent: *Sep. 23, 2014

(54) STRESS-ENGINEERED RESISTANCE-CHANGE MEMORY DEVICE

(75) Inventors: Michael Miller, San Jose, CA (US);
Prashant Phatak, San Jose, CA (US);
Tony Chiang, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 427 days.

This patent is subject to a terminal disclaimer.

(21) Appl. No.: 13/233,937

(22) Filed: Sep. 15, 2011

(65) Prior Publication Data

US 2012/0001148 A1   Jan. 5, 2012

Related U.S. Application Data

(63) Continuation of application No. 12/580,196, filed on Oct. 15, 2009, now Pat. No. 8,049,305.

(60) Provisional application No. 61/106,141, filed on Oct. 16, 2008.

(51) Int. Cl.
| | |
|---|---|
| *H01L 23/52* | (2006.01) |
| *H01L 45/00* | (2006.01) |
| *H01L 23/525* | (2006.01) |
| *H01L 23/522* | (2006.01) |
| *H01L 27/24* | (2006.01) |

(52) U.S. Cl.
CPC .......... *H01L 45/1233* (2013.01); *H01L 23/525* (2013.01); *H01L 23/5228* (2013.01); *H01L 27/2409* (2013.01); *H01L 45/08* (2013.01); *H01L 45/146* (2013.01); *H01L 45/1641* (2013.01)
USPC ............................ 257/529; 257/536; 257/537

(58) Field of Classification Search
CPC ........................... H01L 23/5228; H01L 23/525
USPC ........................................... 257/529, 536, 537
See application file for complete search history.

(56) References Cited

U.S. PATENT DOCUMENTS 8,049,305 B1 * 11/2011 Miller et al. .................. 257/537

* cited by examiner

*Primary Examiner* — Ngan Ngo

(57) ABSTRACT

A resistance-change memory device using stress engineering is described, including a first layer including a first conductive electrode, a second layer above the first layer including a resistive-switching element, a third layer above the second layer including a second conductive electrode, where a first stress is created in the switching element at a first interface between the first layer and the second layer upon heating the memory element, and where a second stress is created in the switching element at a second interface between the second layer and the third layer upon the heating. A stress gradient equal to a difference between the first stress and the second stress has an absolute value greater than 50 MPa, and a reset voltage of the memory element has a polarity relative to a common electrical potential that has a sign opposite the stress gradient when applied to the first conductive electrode.

20 Claims, 7 Drawing Sheets

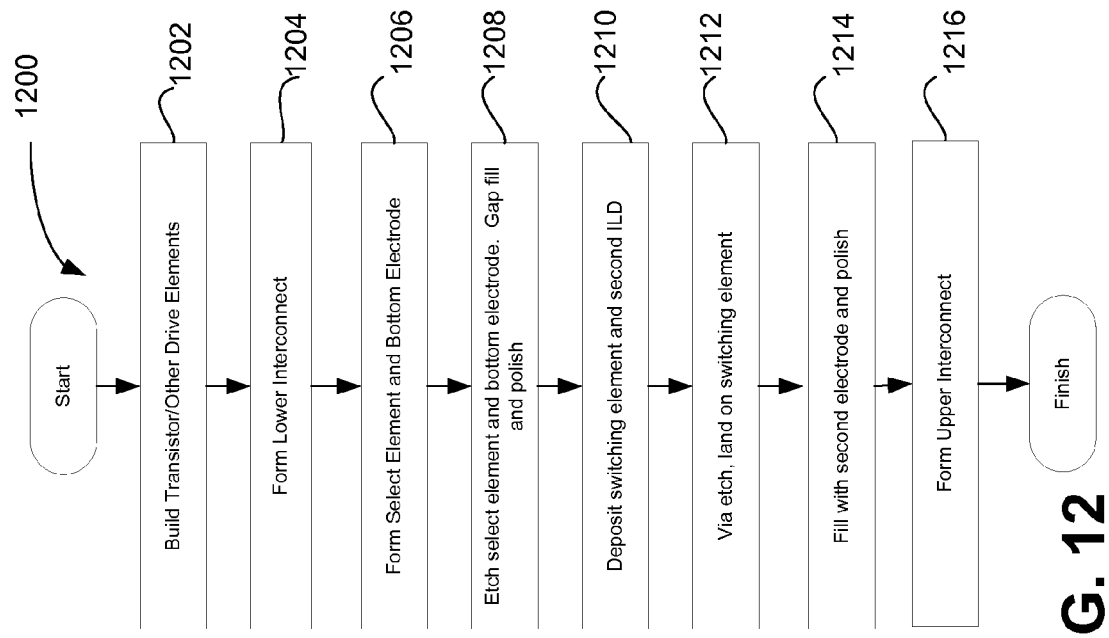
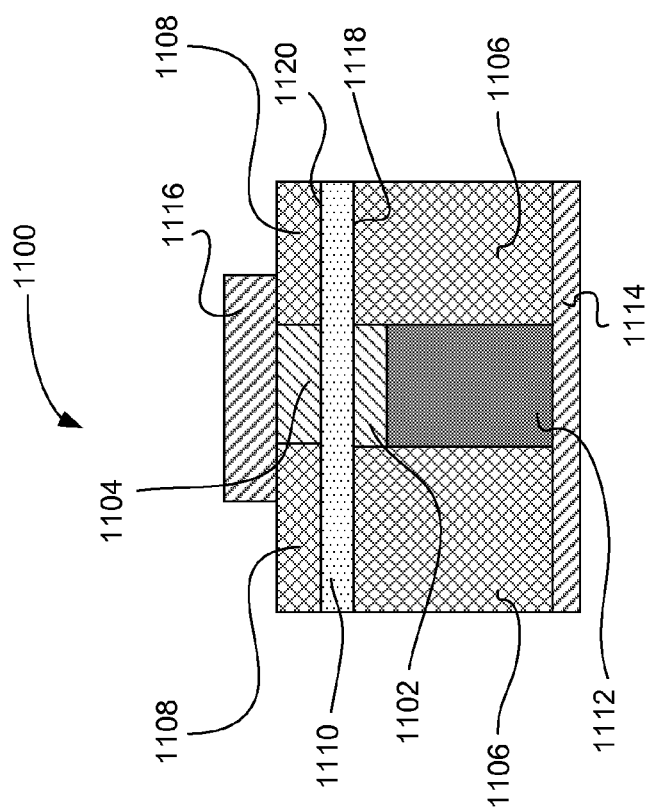
FIG. 11
FIG. 12

US 8,841,745 B2

STRESS-ENGINEERED RESISTANCE-CHANGE MEMORY DEVICE

PRIORITY CLAIM TO PROVISIONAL APPLICATION

This application is a Continuation of U.S. patent application Ser. No. 12/580,196 entitled "Stress-Engineered Resistance-Change Memory Device" filed on Oct. 15, 2009 which is herein incorporated by reference. A claim for priority is hereby made under the provisions of 35 U.S.C. §119 for the present application based upon U.S. Provisional Application No. 61/106,141 entitled "Stress-Engineered Resistance-Change Memory Device" and filed on Oct. 16, 2008, which is incorporated herein by reference.

CROSS-REFERENCE TO RELATED APPLICATION

This application is related to U.S. Utility application Ser. No. 12/255,109 entitled "Non-Volatile Resistive Switching Memories" and filed on Oct. 21, 2008, which is incorporated herein by reference.

FIELD OF THE INVENTION

The present invention relates generally to semiconductor memories. More specifically, a stress engineered resistance-change memory device is described.

BACKGROUND OF THE INVENTION

The development of a commercially viable metal-insulator-metal (MIM) stack for Resistive Random Access Memory (ReRAM) has not yet been achieved partly because there is not a detailed, predictive theory for the mechanism determining these devices' cycling properties. Lacking this, one does not know which device operation parameters have a controlling role in the switching behavior and which ones are dependent variables, or what the relevant material parameters are for the constituent metals and dielectrics in the devices that will make those devices cycle their resistance.

Currently proposed theories for creating a working ReRAM element involve searching for oxides that exhibit switching behavior, assuming that this behavior and its properties are intrinsic functions of the dielectric material used in the device structure. However, other variables may affect the performance of a ReRAM element. Thus, what is needed are new techniques for creating ReRAM elements.

BRIEF DESCRIPTION OF THE DRAWINGS

Various embodiments of the invention are disclosed in the following detailed description and the accompanying drawings:

FIG. 11 illustrates a memory device in which the dielectric layers are responsible for the a large portion of the induced stresses; and FIG. 12 is a flowchart describing a process for creating the memory element shown in FIG. 11.

DETAILED DESCRIPTION

Figure 1:
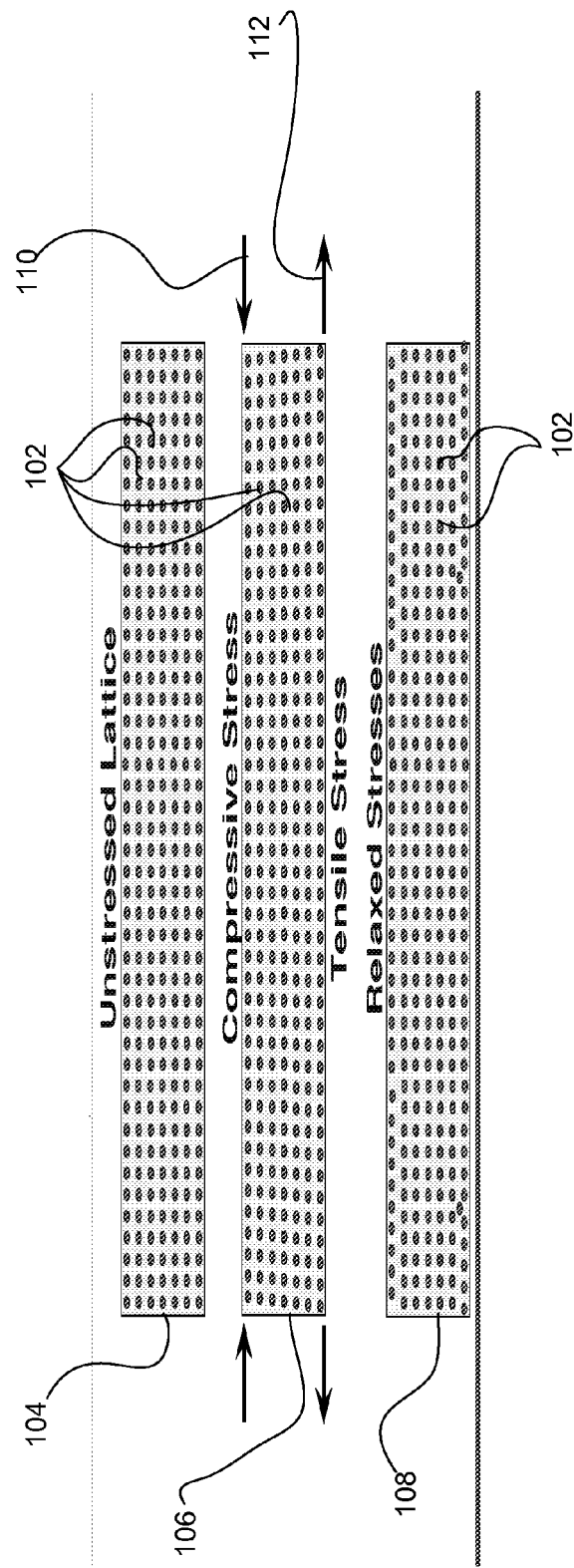
FIG. 1 is a schematic illustration of the creation of defects using stresses.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, a predictive theory based on experimental data can be used to make a resistance switching device, including what materials should be used and what their relative dimensions should be. Furthermore, this theory can be utilized to modulate the leakage (pre-forming) current in a resistance switching material by engineering both the stress and the stress gradient in the material thereby allowing it to achieve greatly increased cycling yield.

According to the various embodiments described herein, an MIM or metal-insulator-semiconductor (MIS) resistive-switching memory element can be formed to exploit the relative stresses created by using materials having different coefficients of thermal expansion (CTEs) and Young's Moduluses. For example, a dielectric that expands at a rate different than the adjacent metal can have defects formed therein that can be useful for building a resistive-switching memory. Additionally, the relative sizes of metals and insulators in the MIM or MIS stack can affect the switching of the memory device.

I. Indicators of Switching Performance

Pre-forming current has been found to be a good predictor of cycling success. That is, devices with pre-forming current in a certain range will typically survive their first cycle of resistance switching, which improves the overall yield of resistance cycling devices. Specifically, for memory elements described herein, pre-forming currents between 0.4 nA and 3 uA, typically exhibit switching in the first cycle. Pre-forming currents in the desirable range are good predicators of cycling success partly because their distribution of forming voltages is reduced from devices with lower pre-forming currents and their ability to switch to a level below the off-current threshold is greater than devices with higher pre-forming current values. Moreover, the methods of altering the pre-forming current level of a device, which include changing the dielectric material's thickness, changing the anneal temperature, changing the thickness of an adjacent layer, and exchanging the material used in one part of the device to another material with a more favorable combination of coefficient of thermal expansion (CTE) and Young's modulus, are consistent with the modulation of stress induced leakage in the dielectric.

These ideas can be used to deposit different films stacks that switch their resistances with different voltage polarities in accordance with a stress-induced defect theory. That is, negative set voltage and positive reset voltage are the natural cycling state of devices where the voltage is applied to the interface of the switching layer that is experiencing more tensile stress (that is, the interface where the atoms in the switching layer are being more strongly pulled outward in the plane of the interface), and positive set voltage and negative reset voltage are the natural cycling state of devices where the voltage is applied to the interface of the switching layer that is experiencing more compressive stress (that is, the interface where the atoms in the switching layer are being more strongly pushed inward in the plane of the interface).

Additionally, this may be applied to unipolar cycling by performing this cycling with voltages of the same sign as the bipolar reset voltage. That is, positive set and reset voltages are the natural cycling state of devices where the voltage is applied to the interface of the switching layer that is experiencing more tensile stress, and negative set and reset voltages are the natural cycling state of devices where the voltage is applied to the interface of the switching layer that is experiencing more compressive stress.

Stress is a parameter that can be used to predict the cycling success of a device for the first time, and can be exploited by material choice and device dimensions to construct a working resistance cycling device. Furthermore, stress can be used to create designs for devices and device structures that will produce the improved resistance cycling performance. Stresses and strains in the switching dielectric material and their gradients are exploitable sources of defects and defect localization in those same switching dielectrics. Without being bound be theory, these defects are in turn responsible for the leakage current observed across the MIM devices containing the switching dielectric. Electrical leakage is in some embodiments a function of thermo-elastic properties of the dielectric and metals in the MIM stack, and, consequently, it is also a function of the thermal processing that the device undergoes at various times before it is operated electrically. As a result, this electrical leakage is a useful measure of the residual effects of the stresses and strains that have been applied to the switching dielectric, which is why observations have shown that it is an indicator of the potential for cycling success of the MIM devices. The stress gradient induced in the switching dielectric has been used to control the spatial localization of different defects within this material, and, therefore, the cycling polarity of the devices containing it. The embodiments described herein for the design and fabrication of devices for memory applications, including for resistance switching memories that differ substantially from those arising from the existing resistive-switching memories.

II. Resistive-Switching Memory Structure and Operation

Resistive-switching devices are typically metal-insulator-metal (MIM) type devices where the insulator can be a controlled thickness of one material or a stack of different materials. The insulator material frequently needs to go through a controlled or "soft" breakdown, called forming, where it transitions from a high resistive state into a low resistive state. In some embodiments, this is accomplished by applying a voltage across the insulator while also limiting the current so that, when the material switches to a low resistive state, it is not damaged by the higher currents now called for by the new lower resistance. The voltage used to cause this first switching event is called the forming voltage, and is generally higher than the subsequent switching voltages. Indeed, it can easily exceed the voltage range that it desirable for a given circuit design, which is one problem faced by some materials that would otherwise be excellent candidates for resistive-switching memories. The device can be returned to the high resistance state by a subsequent application of voltage of either the same or the opposite polarity as the first voltage (application of opposite voltages relative to a common electrical reference such as ground is called bipolar switching, and application of a single voltage polarity is called unipolar switching). This operation is called resetting the switching layer, and the voltage used to accomplish this transition is called the reset voltage. Subsequent application of the same operation that was used in the forming cycle transitions the switching material from the high resistance state back to the low resistance state, and is called a set operation (and the voltage used is called the set voltage).

III. Application of Stresses

A. Physical Effects of Stress

While these resistance transitions have long been observed, it has not previously been understood exactly how the geometry of a resistive-switching device and the choice materials in its construction affect its performance both in the forming and in later cycles. Embodiments described herein can be used to build an improved resistance switching device.

Stress applied to the switching element by lattice and/or CTE mismatches with adjacent layers and by as deposited stress in the layers and their neighboring layers (and modifications of these stresses by the addition of layers adjacent to these neighboring layers) gives rise to strain in the materials in the switching element, which, subsequently, induces defects such as vacancies and interstitials in these materials, and these defects either form the current conduction pathways in the switching element or substantially contribute to the current conduction pathways. FIG. 1 is a schematic illustration of the creation of defects using stresses. In FIG. 1, the position of atoms 102 are shown within an unstressed lattice 104, a lattice 106 undergoing compressive stress and tensile stress, and in their relaxed positions in a relaxed lattice 108 after the stresses are applied.

Stress can generate defects in dielectric materials by pushing (compressive stress 110) or pulling (tensile stress 112) the atoms 102 as shown in the lattice 106 until they are moved out of their locations in the material in order to relax the strain on the bonds around them. Note that compressive stress 110 is relaxed by vacancies and tensile stress 112 is relaxed by interstitials, so, as these defects are generated by stress, they will percolate to where their energy is the lowest. Various defect characteristics can be generated by utilizing stress, including type, population, density, energy level, and spatial distribution within the dielectric materials. Compressive stress 110 generally favors vacancies as they help relax the strain in the dielectric under this stress, and tensile stress 112 generally favors interstitials since they help relax the strain produced in the dielectric by this stress.

B. Calculation of Stresses

In some embodiments, thermal processing induces increased leakage currents in MIM devices, and anneal temperature, dielectric material and top and bottom electrode thickness also affect leakage currents, which supports a stress induced defect theory. Equation 1 shows the formula for calculating the stress on the metal oxide switching element "SE" by the metal electrodes "M" which results from an approximation at a metal/insulator interface:

$$Stress_{SE/M} = \frac{E_{SE}\Delta T(\alpha_{SE} - \alpha_M)}{1 + \frac{2E_{SE}t_{SE}}{E_M t_M}} \qquad \text{Equation 1}$$

Where E=the elastic modulus (Young's Modulus), α=the coefficient of thermal expansion, ΔT=the difference between room temperature and the anneal temperature, and t=the thickness of the layer. Equation 1 assumes an equal oxide coating over both sides of an infinite sheet of metal, without deformation, and does not take into account as-deposited film stress, which would be the intercept on a stress versus ΔT plot.

The formula gives the slope of the stress versus temperature line (so long as no phase transitions or recrystallizations occur); however, the intercept of this line will be the as deposited film stress, which is also relevant to stress engineering. Moreover, it has been demonstrated that bipolar cycling produces improved repetition of resistance switching cycles, but that the set and reset voltages in bipolar cycling should match with the stress gradient regardless of cycling type. That is, positive set voltages and negative reset voltages should be applied to the more compressive interface for bipolar cycling while negative set and reset voltages should be applied to the same interface for unipolar cycling, which is consistent with the stress gradient accumulating specific defects at specific interfaces. One conclusion of this is that resistive-switching is improved when one interface of the switching element localizes one type of defect and the other interface localizes another, which is achieved by selecting one interface to be more compressive, or at least less tensile than the other interface. This, in turn, can be achieved by selecting one electrode of the MIM to be made of a lower CTE metal than the other electrode so that each thermal process induces a stress gradient in the switching element.

Changing the stress gradient in the stack from it being more tensile (or at least less compressive) at one interface of the dielectric to being more tensile (or at least less compressive) on the opposite interface will flip the population of defects, such as oxygen vacancies or interstitials, to the opposite interface from where they were localized with the initial stress configuration. For example, if oxygen vacancies were localized at the upper interface of the dielectric when it is more compressive/less tensile than the lower interface of the dielectric, changing the metal at the lower interface such that this interface now is more compressive/less tensile than the upper interface will change the spatial localization of those oxygen vacancies to this new interface.

IV. Stress and Switching Polarity

Figure 2:
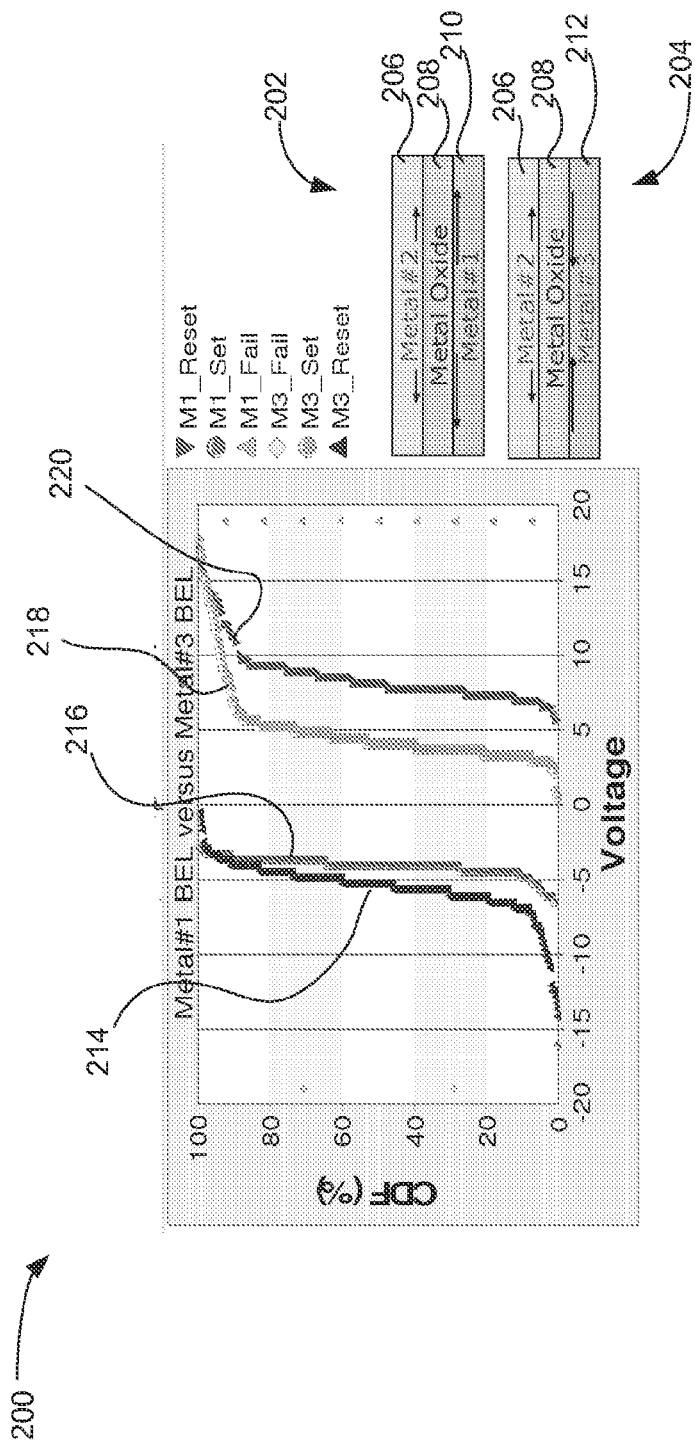
FIG. 2 is a cumulative distribution plot showing the results of changing a metal at an interface with a metal oxide so that the interface changes from a tensile to a compressive interface.

FIG. 2 is a cumulative distribution plot showing the results of changing a metal at an interface with a metal oxide so that the interface changes from a tensile to a compressive interface. The results show set and reset voltages for two memory elements 202 and 204. The memory elements 202 and 204 are both MIM stacks having the same material as the top electrode 206 (Pt) and a same switching material 208 (HfO$_2$). The interface between the top electrodes 206 and the metal oxides 208 is tensile. It is understood that references to a "top" electrode and a "bottom" electrode are for convenience only, and that the memory elements described herein can have any orientation.

The bottom electrode 210 of the memory element 202 and bottom electrode 212 of the memory element 204 are a different metal; the bottom electrode 210 is TiN and the bottom electrode 212 is TaN. The interface between the switching material 208 and the bottom electrode 210 of the first memory element 202 is very tensile because the TiN of the bottom electrode 210 had a substantially higher CTE and Young's Modulus than the switching material 208 while the upper interface was modestly tensile because the Pt of the top electrode 206 material had a modestly higher CTE and similar Young's modulus as the switching material 208.

A cumulative distribution function (CDF) plot 200 shows reset 214 and set 218 voltages for the memory element 206 having a tensile metal/metal oxide interface between the bottom electrode 210 and the switching material 208 and set 216 and reset 218 voltages for the memory element 204 having a compressive interface between the bottom electrode 212 and the switching material 208. As can be seen, the set voltage 218 for the element 204 is positive and the reset voltage 214 is negative, and the set voltage 216 for the element 202 is negative while its reset voltage 220 is positive. The change in the interfaces has led to an inversion of the polarities of the set and reset voltages for the memory elements described herein.

In this embodiment, the MIM devices cycled well when a negative voltage was used to set the devices and positive voltage was used to reset the devices when the voltages were applied to the lower interface (cycling with the opposite set and reset polarities produced negligible cycling yield). However, when the metal below the switching material was changed to one with a lower CTE than the switching oxide, as with the memory element 204, the interface between the switching oxide 208 and the electrode 212 became modestly compressive during subsequent processing, the cycling polarity that produced high cycling yield changed to positive set voltage and negative reset voltage when the voltages were applied to the lower interface. Additionally, these two metals of the bottom electrodes 210 and 212 yielded opposite cycling polarity yet belong to the same class of materials. Other than their different CTEs, the metals have very similar properties (such as work function), illustrating that the stress they induced during the thermal processing of the sample induced the opposite localization of defects and which, in turn, reversed the cycling polarity.

V. Integration Examples

A. Considerations

Using stresses to tailor defects in a resistive-switching layer can lead to several process optimizations. First, consider the order of patterning and anneal operations. If a given metal layer is to induce a certain stress in the switching material adjacent to it, it may be preferable to perform any anneal before patterning these materials to their final size. This will provide the largest and most uniform application of stress to the switching element material(s). Conversely, if a device is to undergo substantial thermal processing after patterning (one whose induced stresses and strains in the switching element are not negligible compared those introduced before patterning), the metals and switching element may need to be reformulated so that the induced stress over their smaller patterned size is sufficient to induce the desired defect concentrations and localizations.

Moreover, it may be necessary to integrate with standard semiconductor processing techniques. This may require the use of silicon dioxide as the interlayer dielectric, and, therefore, the use of the thermo-elastic properties of the upper and lower metal electrodes to induce the desired stresses and strains in the switching dielectric material. Described herein are various examples of integration that can be used with various semiconductor processing, including standard processes and materials such as silicon dioxide.

B. Materials

Generally, the switching elements of the MIM stacks are transition metal oxides. In some embodiments, the metal oxides are those that have a bandgap greater than 4 electron volts (eV), which have exhibited bulk switching properties such as scalable set and reset voltages. Examples of higher-bandgap materials including hafnium oxide ($HfO_2$, bandgap=5.7 eV), aluminum oxide ($Al_2O_3$, 8.4 eV), and tantalum oxide ($Ta_2O_5$, 4.6 eV). Other higher-bandgap materials include zirconium oxide and yttrium oxide.

The electrode materials can include materials such as titanium nitride, tantalum nitride, tungsten, doped silicon (e.g. n-type or p-type), ruthenium, ruthenium oxide, platinum, iridium, iridium oxide, and nickel. Electrodes can be chosen based on properties such as their Young's Modulus (E) and CTE ($\alpha$) so that appropriate stresses are placed on the metal oxide switching element.

One type of resistive-switching memory element described herein includes three layers in an MIM stack. A "layer" in some embodiments refers to a horizontal cross-section through the memory element, whose thickness may correspond to a feature within the layer. For example, a layer including an electrode may have the thickness of the electrode and may include adjacent dielectric materials (e.g. a layer 520 including a switching element 504 in FIG. 5).

In some embodiments, for example, a first layer includes a bottom electrode and adjacent dielectrics, a second layer includes a switching element and adjacent dielectrics, and a third layer includes a top electrode and adjacent dielectrics. In other embodiments, the first layer includes only the bottom electrode, the second layer includes only the switching element, and the third layer includes only the top electrode. In other embodiments, additional layers can be interspersed throughout the memory element.

Figures 3, 4:
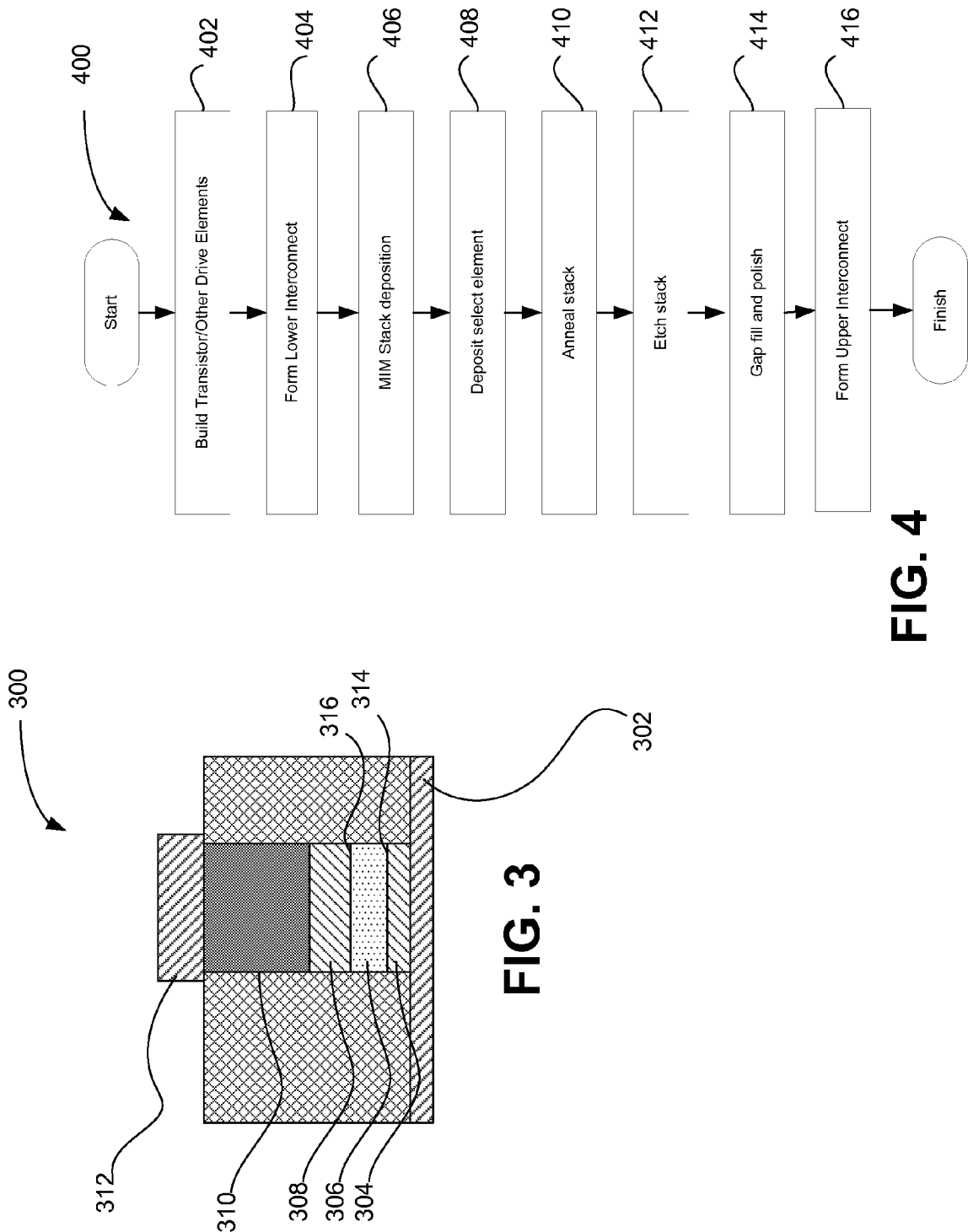
FIG. 3 illustrates an example of a resistive-switching memory structure.
FIG. 4 is a flowchart describing a process for creating the memory element shown in FIG. 3.

A simple MIM stack is shown in FIG. 3, where the stresses on the switching element are determined primarily by the interfaces between the switching element and the electrodes. Any of these layers can also include an adjacent interlayer dielectric (ILD) such as $SiO_2$, which can be used to tune the stresses within the memory element. For example, the first layer can include a relatively small bottom electrode that is surrounded by an ILD; in this case the stress on the resistive-switching element in the second layer is determined primarily by the interface between the switching element and the ILD (see e.g. FIG. 7). Other configurations are possible, for example those shown in FIGS. 5, 9, and 11.

Metal oxides that can be used for switching elements include hafnium oxide ($E_{HfO2}$=83.6 GPa, $\alpha_{HfO2}$=7.2×10$^{-6}$ 1/K), tantalum oxide ($E_{Ta2O5}$=140 GPa, $\alpha_{Ta2O5}$=2.3×10$^{-6}$ 1/K), aluminum oxide ($E_{Al2O3}$=122 GPa, $\alpha_{Al2O3}$=7.9×10$^{-6}$ 1/K), and zirconium oxide ($E_{ZrO2}$=400 GPa, $\alpha_{ZrO2}$=7.06×10$^{-6}$ 1/K). Examples of electrode materials include platinum ($E_{Pt}$=168 GPa, $\alpha_{Pt}$=8.8×10$^{-6}$ 1/K), ruthenium ($E_{Ru}$=432 GPa, $\alpha_{Ru}$=9.1×10$^{-6}$ 1/K), nickel ($E_{Ni}$=283.6 GPa, $\alpha_{Ni}$=7.2×10$^{-6}$ 1/K), titanium nitride ($E_{TiN}$=200-1000 GPa, $\alpha_{TiN}$=9.35×10$^{-6}$ 1/K), and tantalum nitride ($E_{TaN}$=400 GPa, $\alpha_{TaN}$=3.6×10$^{-6}$ 1/K).

VI. Processing Techniques and Examples

A. Standard Processing Techniques

FIG. 3 illustrates a first example of a resistive-switching memory element 300. The memory element 300 is a memory element in which the MIM layers all have roughly the same width. FIG. 4 is a flowchart describing a process 400 for creating the memory element 300. The memory element 300 includes a first conductive electrode 304 (e.g. a bottom electrode), a switching element 306 (e.g. a metal oxide such as hafnium oxide), and a second conductive electrode 308. Upon heating the memory element 300 (e.g. during an anneal after the formation of the various layers of the element), a first stress is created in the switching element 304 at a first interface 314 between the first conductive electrode 304 and the switching element 306, and a second stress is created in the switching element 304 at a second interface 316 between the second conductive electrode 308 and the switching element 306. The difference between the first stress and the second stress can be referred to as the stress gradient and is given in Equation 2:

$$\text{Gradient} \leq \text{Stress}_{SE/BEL} - \text{Stress}_{SE/TEL} \qquad \text{(Equation 2)}$$

The stress gradient changes based on the materials selected for and the thicknesses of the electrodes 304 and 308 and the switching element 306.

In general, if the absolute value of the stress gradient is greater than 50 MPa for the memory element 300, sufficient defects are created in the metal oxide of the switching element 306 that the switching polarity of the memory element can be determined (also see Table 1). More specifically, some materials systems with stress gradients between 50 MPa and 2000 MPa, or between 100 MPa and 1500 MPa have shown reliable switching characteristics and switching polarities. In this example, if the gradient is positive (that is, the stress at the second interface 316 is lower, which means that it is more tensile/less compressive, than the stress at the first interface 314), then the reset voltage polarity is negative relative to a common electrical potential (e.g. ground or another selected voltage) at the first conductive electrode 304. If the gradient is negative, then the reset voltage polarity is positive relative to a common electrical potential at the first conductive electrode 304. In other words, the reset voltage polarity at the first conductive electrode 304 has a sign opposite the stress gradient.

Examples of materials in a stack that may satisfy this relationship include a hafnium oxide switching element 306, a platinum top electrode 308 and a titanium nitride (TiN) bottom electrode 304 in which the switching element has its resistance reset with a with a positive voltage on the platinum. For example, in a system using a 15 nm thick layer of hafnium oxide ($E_{HfO2}$=283.6 GPa, $\alpha_{HfO2}$=7.2×10$^{-6}$ 1/K) as a switching element 306, a 20 nm platinum ($E_{Pt}$=276 GPa, $\alpha_{Pt}$=8.9×10$^{-6}$ 1/K) top electrode 308, and a 20 nm titanium nitride ($E_{TiN}$=500 GPa, $\alpha_{TiN}$=9.35×10$^{-6}$ 1/K) bottom electrode 304, the stress gradient is ≤−108 MPa after annealing at a temperature of 800 C (i.e., −108 MPa is the stress in an infinite sheet of this MIM stack; however, spatial localization somewhat reduces the total magnitude of the stress here). Although specific materials are given in this example, it is understood that other materials can be used.

Returning to the process 400 shown in FIG. 4, in operation 402, transistors and other drive elements are built, and in operation 404, an interconnect 302 is formed to connect to the drive elements. The memory element 300 is built on the interconnect 302. In operation 406, sequential blanket depositions of a first conductive electrode 304 (e.g. the bottom electrode), a switching element 306 (e.g. a metal oxide), a second conductive electrode 308 (e.g., the top electrode), are completed to perform an MIM stack deposition. The first conductive electrode 304, the switching element 306, and the second conductive electrode 308 all have roughly the same size at interfaces 314 and 316. In operation 408, the materials of the select element 310 (e.g. a diode) are formed. This stack is then annealed in operation 410 to preserve the stresses and strains that the electrode 304 and the electrode 308 induce in the memory element 300, and is subsequently etched into a column in operation 412.

A gap fill and polish is performed in operation 414, the whole structure is planarized by CMP, and another interconnect 312 is formed in operation 416, resulting in the memory structure 300. Alternatively, the select element 308 could also be deposited under the first conductive electrode 304, leaving the second conductive electrode 308 as the final layer before anneal and patterning.

This fabrication process allows for substantial overlap with standard semiconductor processing materials and practices. In some embodiments, however, these devices may be fabricated in vertical as well as horizontal arrays. In these horizontal arrays, the anneals and processing carried out during the fabrication of the devices above this device may potentially affect the stress that was engineered into the switching dielectric material of this device. One approach is to engineer the stresses and strains in each layer of devices to account for the effect of the processing of subsequent layers of devices. Another is to modify the geometry and engineering of the devices to help negate this effect.

B. Large Bottom Electrode

Figure 5:
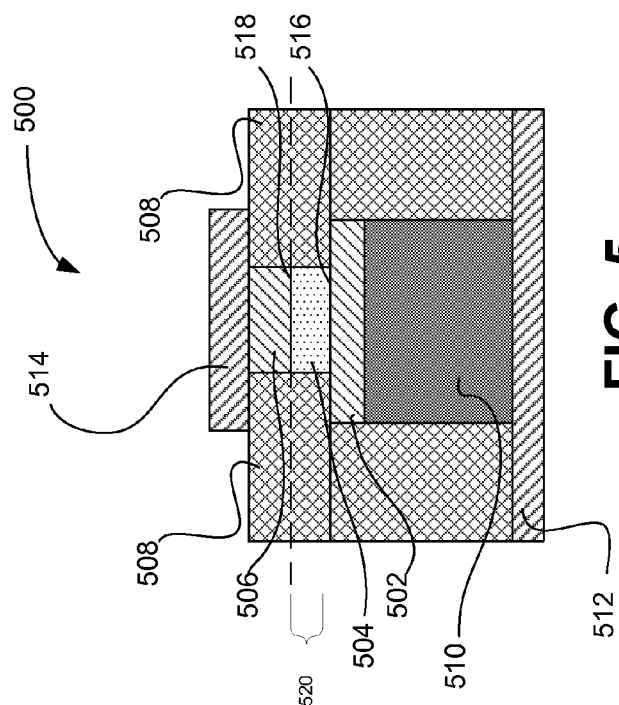
FIG. 5 illustrates a resistive-switching memory structure including a memory element having one electrode that is larger than the switching element.

FIG. 5 illustrates a resistive-switching memory structure 500 including a memory element having one electrode that is larger than the switching element. As shown here, a bottom electrode 502 is larger in the horizontal direction than the switching element 504. As a result, the reduction in the amount stress that this metal applies to the switching element 504 across its width during subsequent thermal exposure is minimized, and the bottom electrode 502 is primarily responsible for the stresses on the switching element at the lower interface Assuming that the ILD in this device build will be silicon dioxide or another low CTE material, it may be advantageous to have the bottom electrode 502 be the higher CTE electrode (i.e., for switching material 504 to be placed in tension at its interface with the bottom electrode 502), and a top electrode 506 to be the lower CTE electrode (i.e., for the switching material 504 to be placed in compression at its interface with the top electrode 506) since the top electrode 504 is much smaller than the bottom electrode 502. This way, in subsequent thermal cycling (such as during the annealing of subsequent layers) the top electrode 506 and the ILD 508 work in concert to place the switching element 504 in compression while the bottom electrode 502 works alone to induce tensile stress in the switching material 504. Again, the select element 510 could also have been deposited after the top electrode 506 instead of before the bottom electrode 502, making it the last layer to be deposited before the annealing and patterning of the memory element.

Figure 6:
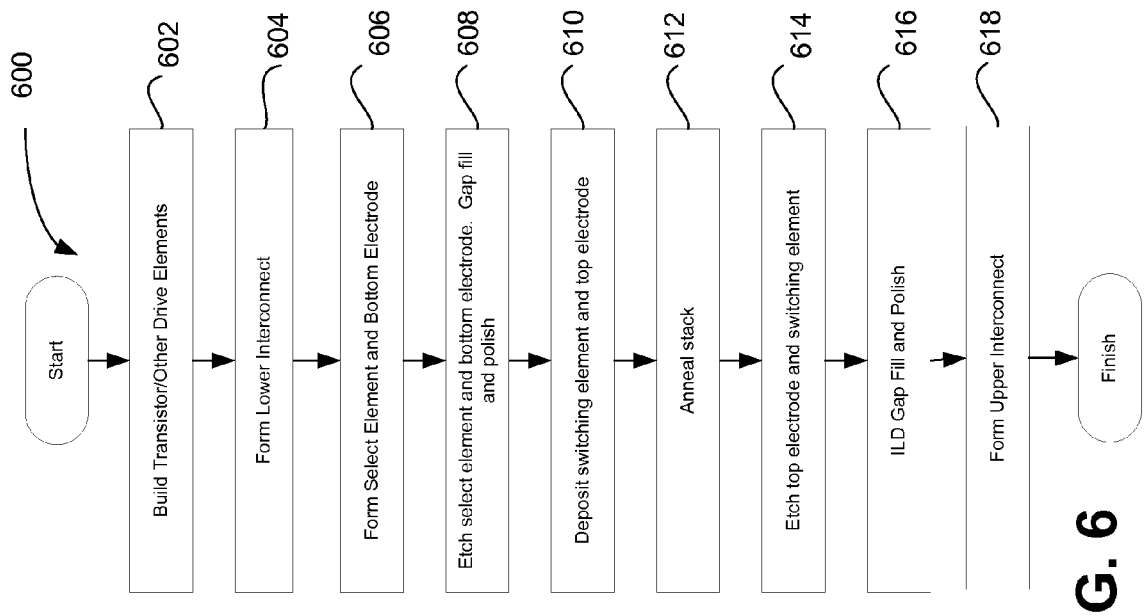
FIG. 6 is a flowchart describing a process for creating the memory element shown in FIG. 4.

FIG. 6 is a flowchart describing a process 600 for building the memory structure 500. In operation 602, the transistor and other drive elements are formed, and in operation 604, a lower interconnect 512 is formed. In operation 606, the select element 510 and the bottom electrode 502 are deposited. It is understood that in other embodiments, the select element 510 can also be formed above the top electrode 506. In operation 608, the select element 510 and bottom electrode 502 are etched. In operation 610, the switching element 504 and the top electrode 506 are deposited. In operation 612, the structure is annealed. In operation 614, the switching element 504 and the top electrode 506 are etched to have a size smaller than the bottom electrode 502. The structure 500 is finished in operation 616 with an ILD gapfill and CMP process, and in operation 618, an upper interconnect 514 is deposited on the structure 500.

The stress gradient of greatest interest for the memory element 500 is approximately the same as for the memory element 300 and can be calculated using Equation 2. The preferred CTE relationship is for a first stress in the switching element 504 at an interface 518 between the top electrode 506 and the switching element 504 to be at least 50 MPa greater (or between 50 MPa-2000 MPa, or 100 MPa-1500 MPa greater) than a second stress in the switching element 504 at an interface 516 between the bottom electrode 502 and the switching element 504. If the memory element 500 has this preferred relationship, then the polarity of the reset voltage at the bottom electrode 502 is positive relative to a common electrical reference. Examples of materials in a stack that may satisfy this relationship include a 15 nm hafnium oxide switching element 504, a 20 nm ruthenium oxide top electrode 506, and a 20 nm titanium nitride bottom electrode 502 in which the switching element has its resistance reset with a with a positive voltage on the titanium nitride. The stress gradient in the switching element of this example stack would be less than or approximately equal to −418 MPa after annealing at a temperature of 800 C.

C. Small Bottom Electrode

In embodiments using the same material for top and bottom electrodes or where the desired stress cannot be induced solely using metal layer material properties, one can pattern a small metal contact within a dielectric layer, such as silicon dioxide, and deposit the switching element and upper metal electrode on this substrate. During subsequent processing the thermo-elastic properties that dictate the stress induced in the switching element at its lower interface are primarily those of the dielectric layer under it rather than those of the small metal contact patterned into this dielectric. In this way, the dielectric material can be selected for the desired stress properties.

Figure 7:
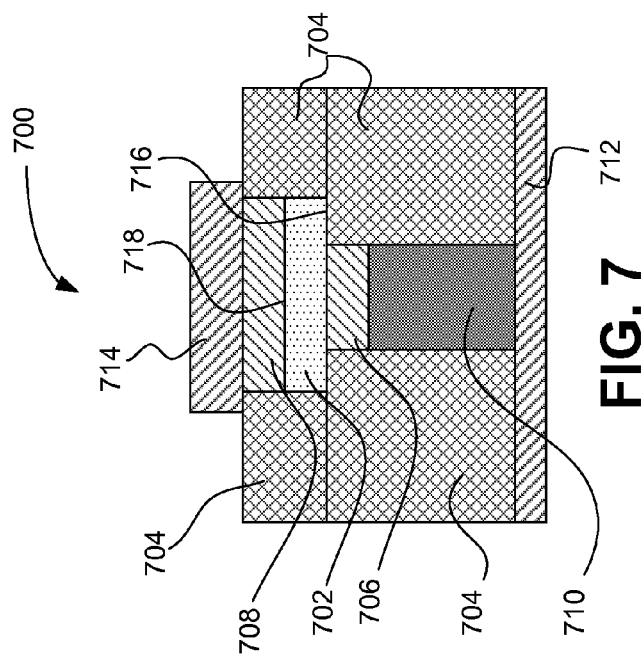
FIG. 7 illustrates a resistive-switching memory structure including a memory element having one electrode that is smaller than the switching element.

This memory device 700 is illustrated in FIG. 7 and can induce stresses and stress gradients in the switching element 702 by exploiting the relative thermo-elastic properties of the ILD 704 below the switching element 702 as compared to those of the material(s) in the switching element 702. This enables the use of $SiO_2$ (or other low CTE dielectrics) to induce compressive stress at this interface of the switching layer, freeing the bottom electrode 706 of the constraint of providing this stress. Moreover, with its extremely low CTE ($\alpha_{SiO2}=5\times10^{-7}$ 1/K), $SiO_2$ (and its analogs) is (are) capable of providing a larger compressive stress than many other metals that the electrodes would have been made of are capable of providing. Again, as in device 500 shown in FIG. 5, in some embodiments, the stress and stress gradient in the switching element will be larger, more uniform, and more resistant to modification by subsequent thermal cycling if the bottom electrode 706 is the low CTE electrode and the top electrode 708 is the high CTE electrode. Also, the select element 710 could have been deposited after the top electrode 708 rather than before the bottom electrode 706, leaving it to be the last layer to be deposited before the annealing and patterning of the switching element.

Figure 8:
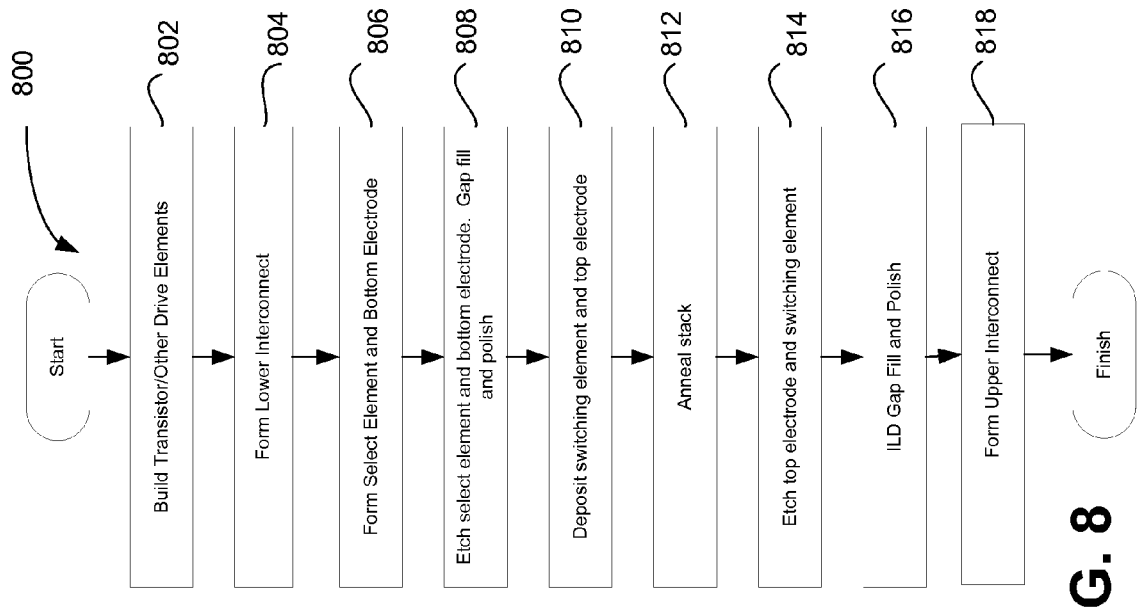
FIG. 8 is a flowchart describing a process for creating the memory element shown in FIG. 7.

FIG. 8 is a flowchart describing a process 800 for building the memory device 700. In operation 802, the transistor and other drive elements are formed, and in operation 804, a lower interconnect 712 is formed. In operation 806, the select element 710 and the bottom electrode 706 are deposited. In operation 808, the select element 710 and bottom electrode 702 are etched. In operation 810, the switching element 702 and the top electrode 708 are deposited. In operation 812, the device 700 is annealed. In operation 814, the switching element 702 and the top electrode 708 are etched to have a size larger than the bottom electrode 706. The device 700 is finished in operation 816 with an ILD gapfill and CMP process, and in operation 818, an upper interconnect 714 is deposited on the device 700.

The stress gradient of greatest interest for the memory element 700 can be calculated using Equation 3:

$$\text{Gradient} \leq \text{Stress}_{SE/ILD} - \text{Stress}_{SE/TEL} \quad \text{(Equation 3)}$$

Where $\text{Stress}_{SE/ILD}$ is the stress in the switching element 702 at the interface 716 between the switching element 702 and the ILD 704 adjacent to the bottom electrode 706. The preferred CTE relationship is for a first stress in the switching element 702 at the interface 716 between the ILD 704 and the switching element 702 to be at least 50 MPa greater than (or between 50 MPa-2000 MPa, or 100 MPa-1500 MPa greater than) a second stress in the switching element at the interface 718 between the top electrode 708 and the switching element 702. If the memory element 700 has this relationship, then the polarity of the reset voltage at the bottom electrode 702 is negative relative to a common electrical reference. Examples of materials in a stack that may satisfy this relationship include a hafnium oxide switching element 702, a titanium nitride (TiN) top electrode 708, a TiN bottom electrode 706, and a silicon dioxide ILD 704 in which the switching element has its resistance reset with a with a negative voltage on the TiN bottom electrode. For example, in a system using a 15 nm hafnium oxide switching element 702, a 20 nm titanium nitride (TiN) top electrode 708, a titanium nitride bottom electrode 706, and 200 nm of silicon oxide ILD 704, the stress gradient would be less than or approximately equal to 300 GPa after annealing at a temperature of 800 C.

D. Memory Element Surrounding Top Electrode

Figure 9:
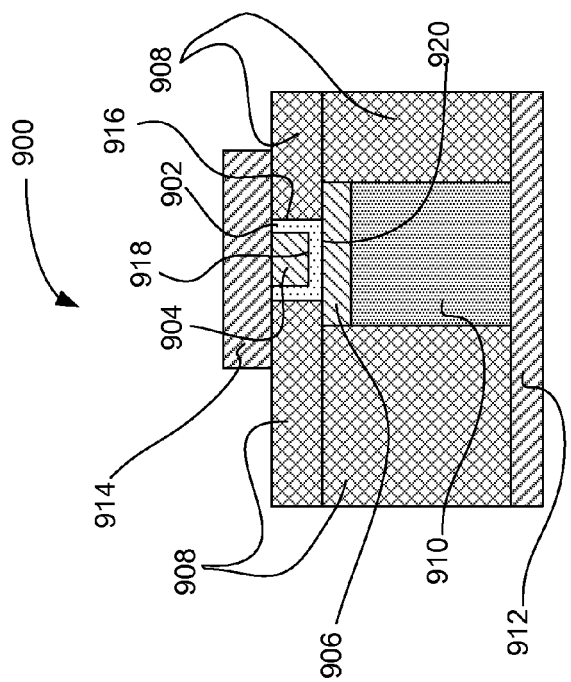
FIG. 9 illustrates a memory device in which the switching element surrounds the bottom electrode.

FIG. 9 illustrates a memory device 900 in which the switching element surrounds the top electrode. The device 900 is similar to the device 500, shown in FIG. 5, but here a switching element 902 is wrapped around a top electrode 904; however, the stresses on the switching element 902 can be changed by this difference in configuration. The configuration of the device 900 allows the anneal to be performed after the fully patterned stack is completed, which means that one can wait until the entire vertical integration is complete and anneal all the stacks together, removing the need for annealing earlier layers multiple times. Secondly, the three dimensional shape provides additional different stress, stress gradient, and stress localization possibilities. Additionally, the second ILD deposition is now an active participant in providing stresses and strains on the switching element, and the shape can also dramatically increase the surface area of the interface between the top electrode 904 and the switching element 902, which increases the potential to induce stress in the switching element, without increasing the size of the active device.

Using standard fabrication techniques, $SiO_2$ can be used as the ILD in both steps, which would lend itself to the top electrode 904 being the low CTE metal contact and a bottom electrode 906 being the high CTE metal contact since the top electrode 904 is smaller and is surrounded by ILD 908 laterally allowing the ILD 908 to buttress the stress induced by the top electrode 904. However, if the higher CTE metal has a very high CTE (such that a small volume could still induce enough stress in the switching element), one could use this as the top electrode 904 and the low CTE metal as the bottom electrode 906. A select element 910 is deposited on a lower level interconnect 912. Alternatively, it is understood that the select element 910 could also have been deposited after the planarization of the top electrode 904 instead of before deposition of the bottom electrode 906. Additional level interconnects 914 can be deposited over the top electrode 904.

Figure 10:
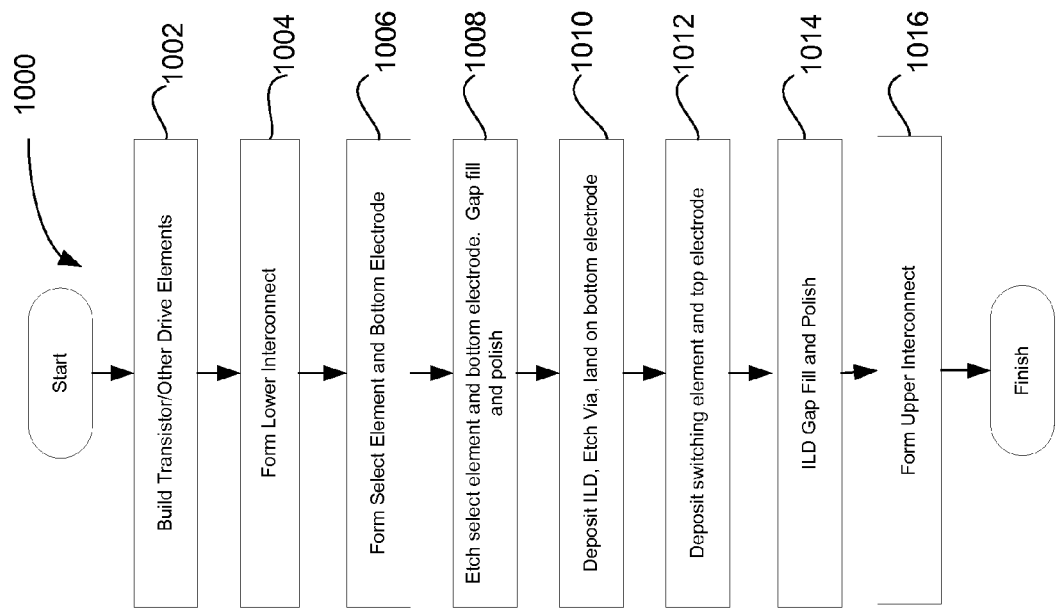
FIG. 10 is a flowchart describing a process for creating the memory element shown in FIG. 9.

FIG. 10 is a flowchart describing a process 1000 for building the memory device 900. In operation 1002, the transistor and other drive elements are formed, and in operation 1004, the lower interconnect 912 is formed. In operation 1006, the select element 910 and the bottom electrode 906 are deposited. In operation 1008, the select element 910 and bottom electrode 906 are etched and a gap fill and polish are performed. In operation 1010, the ILD 908 is deposited and etched to form a via over the bottom electrode 906. In operation 1012, the switching element 902 is deposited in the via, and the top electrode 904 is deposited within the switching element 902. The device 900 is finished in operation 1014 with an ILD gapfill and CMP process, and in operation 1016, an upper interconnect 914 is deposited on the device 900.

Because one side of the switching element 902 contacts both the bottom electrode 906 and the ILD 908, two equations are used to describe the desired stress relationship. The stress gradients of greatest interest for the memory element 900 can therefore be given by Equations 2 (above) and Equation 4.

The absolute value of the gradient given by Equation 2 should be at least 30 MPa. Using this gradient, the preferred stress relationship is for a first stress in the switching element 902 at an interface 918 between the top electrode 904 and the switching element 902 to be greater than a second stress in a switching element 902 at a second interface 920 between the bottom electrode 906 and the switching element 902. The second gradient is given by:

$$\text{Gradient Stress}_{SE/BEL} - \text{Stress}_{SE/ILD} \quad \text{(Equation 4)}$$

Where $\text{Stress}_{SE/ILD}$ is the stress in the switching element 902 at the interface 916 between the switching element 902 and the ILD 908 adjacent to the switching element 902. The absolute value of this gradient should be at least 30 MPa. The preferred relationship for this gradient is for a first stress in the switching element 902 at an interface 920 between the switching element 902 and the bottom electrode 906 to be less than a second stress in the switching element 902 at an interface 916 between the ILD 908 and the switching element 902. If the memory element 900 has these relationships, then the polarity of the reset voltage at the bottom electrode 902 is positive relative to a common electrical reference. Examples of materials in a stack that may satisfy this relationship include a hafnium oxide switching element 902, a ruthenium oxide top electrode 904, a titanium nitride bottom electrode 906, and a silicon dioxide ILD 908. For example, in a system using a 15 nm hafnium oxide switching element 902, a 20 nm ruthenium oxide top electrode 904, a 20 nm titanium nitride bottom electrode 906, and 200 nm of silicon oxide ILD, the stress gradient within the switching element from the bottom electrode to the top electrode would be less than or approximately equal to −418 MPa while the stress gradient within the switching element from the bottom electrode to the ILD would be less than or approximately equal to −300 MPa after annealing at a temperature of 800 C.

E. Using ILDs to Induce Stress

FIG. 11 illustrates a memory device 1100 in which the dielectric layers are responsible for the a large portion of the induced stresses. For example, a stack includes small electrodes 1102 and 1104 in lower 1106 and upper 1108 dielectric layers that sandwich a switching element 1110. These upper 1106 and lower 1108 dielectric layers are configured to create the desired stress and stress gradients to promote optimal switching in the sandwiched switching element material(s). In such cases, silicon oxide or silicon carbide, among other low CTE materials, can be used to secure compressive stress at the interface between the switching element 1110 and this material, and silicon carbide doped with boron nitride, certain doped silicon nitrides, aluminum oxide, or more exotic oxides like those of the alkali earths and some rare earth metals that have high CTE, such as beryllium oxide, magnesium oxide, thorium oxide, and lanthanum oxide could have high enough CTE, depending on the CTE of the switching dielectric, to secure a tensile stress in the switching dielectric at its interface with this dielectric layer.

One benefit of this embodiment is that thermal processing to induce the stresses and strains in the switching dielectric layers could be carried out at the end of all patterning and processing since the metals in the MIM stack are not the primary source of stress and strain, stress induced defects, or stress induced localization of these defects. However, one could increase the uniformity of the stress induced by the dielectric by attempting to roughly match the CTE of the metal contact with that of the dielectric through which it travels. The select element 1112 is deposited over a lower interconnect 1114, however, the select element 1112 could also have been deposited above the top electrode 1104 rather than under the bottom electrode 1102. A top interconnect 1116 can be deposited above the dielectric layer 1118.

FIG. 12 is a flowchart describing a process 1200 for building the memory device 1100. In operation 1202, the transistor and other drive elements are formed, and in operation 1204, the lower interconnect 1114 is formed. In operation 1206, the select element 1112 and the bottom electrode 1102 are deposited. In operation 1208, the select element 1112 and bottom electrode 1102 are etched and a gap fill and polish are performed. In operation 1210, the switching element 1110 and the upper dielectric layer 1108 are deposited. The upper dielectric layer 1108 is etched to form a via over the switching element 1110. In operation 1214, the top electrode 1104 is deposited in the via, and polished using CMP or another process. In operation 1216, an upper interconnect 1116 is deposited on the device 1100.

The stress gradient of greatest interest for the memory element 1100 can be calculated using Equation 5:

$$\text{Gradient} = \text{Stress}_{SE/ILD1} - \text{Stress}_{SE/ILD2} \quad \text{(Equation 5)}$$

Where $\text{Stress}_{SE/ILD1}$ is the stress in the switching element 1110 at the interface 1118 between the switching element 1110 and the lower dielectric layer 1106, and $\text{Stress}_{SE/ILD2}$ is the stress in the switching element 1110 at the interface 1120 between the switching element 1110 and the upper dielectric layer 1108. The absolute value of this gradient should be at least 50 MPa (or between 50 MPa-2000 MPa, or 100 MPa-1500 MPa). If the memory element 1100 has this relationship, then the polarity of the reset voltage at the bottom electrode 1102 is opposite the sign of the gradient (e.g. if the gradient is negative, then the polarity is positive). Examples of materials that may satisfy this relationship include a hafnium oxide switching element 1110, a silicon dioxide dielectric layer 1106, and an aluminum oxide dielectric layer 1108. For example, in a system using a 15 nm hafnium oxide switching element 1110, a 120 nm silicon dioxide dielectric layer 1106, and a 60 nm aluminum dioxide dielectric layer 1106, the stress gradient would be less than or approximately equal to 751 MPa after annealing at a temperature of 800 C.

E. Examples

Table 1 summarizes the parameters for the devices 300, 500, 700, 900, and 1100. Note that in addition to the stress and stress gradient options that have been discussed here, there are numerous other possibilities that these device build schemes enable, including providing tensile stress in the vertical direction and compressive stress in the horizontal direction, providing a more uniform distribution of both defects.

TABLE 1

| Memory Element | Stress Gradient of Greatest Interest | Absolute Value of Stress Gradient of Greatest Interest | Preferred CTE Relationship | Cycling Polarity of Reset for this CTE Relationship (if applied to bottom electrode) |
|---|---|---|---|---|
| 300 | $\text{Stress}_{SE/BEL} - \text{Stress}_{SE/TEL}$ | >50 MPa | 1. $\text{Stress}_{SE/BEL} > \text{Stress}_{SE/TEL}$ or 2. $\text{Stress}_{SE/BEL} < \text{Stress}_{SE/TEL}$ | 1. Negative 2. Positive |
| 500 | $\text{Stress}_{SE/BEL} - \text{Stress}_{SE/TEL}$ | >50 MPa | $\text{Stress}_{SE/BEL} < \text{Stress}_{SE/TEL}$ | Positive |
| 700 | $\text{Stress}_{SE/ILD} - \text{Stress}_{SE/TEL}$ | >50 MPa | $\text{Stress}_{SE/ILD} > \text{Stress}_{SE/TEL}$ | Negative |
| 900 | $\text{Stress}_{SE/BEL} - \text{Stress}_{SE/TEL}$ and $\text{Stress}_{SE/ILD} - \text{Stress}_{SE/BEL}$ | Each gradient should be >30 MPa | $\text{Stress}_{SE/BEL} < \text{Stress}_{SE/TEL}$ and $\text{Stress}_{SE/ILD} < \text{Stress}_{SE/BEL}$ | Positive |

TABLE 1-continued

| Memory Element | Stress Gradient of Greatest Interest | Absolute Value of Stress Gradient of Greatest Interest | Preferred CTE Relationship | Cycling Polarity of Reset for this CTE Relationship (if applied to bottom electrode) |
|---|---|---|---|---|
| 1100 | $\text{Stress}_{SE/ILD1} - \text{Stress}_{SE/ILD2}$ | >50 MPa | 1. $\text{Stress}_{SE/ILD1} - \text{Stress}_{SE/ILD2}$ or 2. $\text{Stress}_{SE/ILD1} - \text{Stress}_{SE/ILD2}$ | 1. Negative 2. Positive |

Although the foregoing examples have been described in some detail for purposes of clarity of understanding, the invention is not limited to the details provided. There are many alternative ways of implementing the invention. The disclosed examples are illustrative and not restrictive.

What is claimed:

1. A resistive-switching memory element comprising:
a first layer operable as a first conductive electrode;
a second layer disposed above the first layer and operable as a second conductive electrode; and
a third layer disposed between the first layer and the second layer,
   the third layer operable as a resistive-switching element,
   the third layer having a first surface facing the first layer,
   the third layer having a second surface facing the second layer;
   the third layer having a stress differential between the first surface and the second surface of greater than 50 mPa.

2. The resistive-switching memory element of claim 1, further comprising an interlayer dielectric (ILD) interfacing the first surface of the third layer.

3. The resistive-switching memory element of claim 1, wherein a portion of the third layer is operable as an ILD, and wherein the first surface is formed by the ILD.

4. The resistive-switching memory element of claim 1, further comprising a first ILD and a second ILD, wherein the first surface interfaces the first ILD, and wherein the second surface interfaces the second ILD.

5. The resistive-switching memory element of claim 1, wherein:
the first layer comprises one of titanium nitride or doped silicon;
the third layer comprises one of hafnium oxide, aluminum oxide, tantalum oxide, yttrium oxide, or zirconium oxide; and
the second layer comprises one of platinum, ruthenium, ruthenium oxide, tungsten, iridium, iridium oxide, or titanium nitride.

6. The resistive-switching memory element of claim 1, wherein the third layer comprises a material having a bandgap greater than 4 electron volts (eV).

7. The resistive-switching memory element of claim 1, wherein:
the first layer comprises titanium nitride;
the third layer comprises one of hafnium oxide, aluminum oxide, tantalum oxide, zirconium oxide, or yttrium oxide; and
the second layer comprises one of platinum, n-doped polysilicon, or p-doped polysilicon.

8. The resistive-switching memory element of claim 1, wherein a pre-forming current of the resistive-switching memory element is between 0.4 nA and 3 μA.

9. The resistive-switching memory element of claim 1, wherein an absolute value of the stress differential is less than 2000 MPa.

10. The resistive-switching memory element of claim 1, further comprising a select element beneath the first layer.

11. The resistive-switching memory element of claim 10, wherein the select element is a diode.

12. A method of forming a resistive-switching memory element, the method comprising:
forming a first layer operable as a first conductive electrode;
forming a second layer above the first layer,
   the second layer operable as a second conductive electrode;
forming a third layer disposed between the first layer and the second layer,
   the third layer operable as a resistive-switching element,
   the third layer having a first surface facing the first layer;
   the third layer having a second surface facing the second layer; and
providing a stress differential in the third layer between the first surface and the second surface of greater than 50 mPa.

13. The method of claim 12, wherein the third layer comprises one of hafnium oxide, tantalum oxide, aluminum oxide, yttrium oxide, or zirconium oxide.

14. The method of claim 12, wherein forming the first layer comprises forming an interlayer dielectric (ILD) adjacent to the first conductive electrode.

15. The method of claim 12, wherein forming the second layer comprises forming an ILD adjacent to the second conductive electrode.

16. The method of claim 12, further comprising:
forming a select element beneath the first layer.

17. The resistive-switching memory element of claim 2, wherein the ILD comprises $SiO_2$.

18. The resistive-switching memory element of claim 1, wherein the stress differential between the first surface and the second surface is between 50 mPa and 2000 mPa.

19. The resistive-switching memory element of claim 1, wherein the stress differential between the first surface and the second surface is between 100 mPa and 1500 mPa.

20. The method of claim 12, wherein the stress differential in the third layer is provided by heating the resistive-switching memory element comprising the first layer, the second layer, and the third layer.

* * * * *